(12) United States Patent
Goeoetz et al.

(10) Patent No.: US 8,841,153 B2
(45) Date of Patent: Sep. 23, 2014

(54) METHOD FOR PRODUCING A DOPED ORGANIC SEMICONDUCTING LAYER

(75) Inventors: Britta Goeoetz, Regensburg (DE); Thomas Dobbertin, Regensburg (DE); Karsten Diekmann, Rattenberg (DE); Andreas Kanitz, Hoechstadt (DE); Guenter Schmid, Hemhofen (DE); Arvid Hunze, Erlangen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/919,989

(22) PCT Filed: Feb. 25, 2009

(86) PCT No.: PCT/DE2009/000280
§ 371 (c)(1),
(2), (4) Date: Jan. 13, 2011

(87) PCT Pub. No.: WO2009/106068
PCT Pub. Date: Sep. 3, 2009

(65) Prior Publication Data
US 2011/0124141 A1   May 26, 2011

(30) Foreign Application Priority Data

Feb. 27, 2008  (DE) .......................... 10 2008 011 185

(51) Int. Cl.
*H01L 51/50* (2006.01)
*H01L 51/00* (2006.01)

(52) U.S. Cl.
CPC .......... *H01L 51/5052* (2013.01); *H01L 51/002* (2013.01); *H01L 51/0083* (2013.01); *H01L 51/0071* (2013.01); *H01L 51/0084* (2013.01); *H01L 51/0072* (2013.01); *H01L 51/001* (2013.01)
USPC ................................... 438/45; 438/99; 257/40

(58) Field of Classification Search
CPC .......................... H01L 51/001–51/002; H01L 51/0071–51/0072; H01L 51/0083–51/0084; H01L 51/5052
USPC ..................... 438/45, 276, 510, 514, 537, 542
See application file for complete search history.

(56) References Cited

U.S. PATENT DOCUMENTS

| 6,649,210 B2 | 11/2003 | Tokailin et al. |
| 7,067,170 B2 | 6/2006 | Marcus et al. |
| 7,238,389 B2 | 7/2007 | Long et al. |
| 2002/0155230 A1* | 10/2002 | Forrest et al. .................. 427/596 |
| 2004/0132228 A1 | 7/2004 | Magno et al. |
| 2004/0142098 A1 | 7/2004 | Ghosh et al. |
| 2005/0121667 A1 | 6/2005 | Kuehl et al. |

(Continued)

FOREIGN PATENT DOCUMENTS

| DE | 101 16 876 | 10/2002 |
| DE | 103 57 044 | 7/2005 |

(Continued)

*Primary Examiner* — Olik Chaudhuri
*Assistant Examiner* — Christine Enad
(74) *Attorney, Agent, or Firm* — Cozen O'Connor

(57) ABSTRACT

A process is provided for producing a doped organic semiconductive layer, comprising the process steps of A) providing a matrix material, B) providing a dopant complex, and C) simultaneously applying the matrix material and the dopant complex to a substrate by vapor deposition, wherein, in process step C), the dopant complex is decomposed and the pure dopant is intercalated into the matrix material.

7 Claims, 2 Drawing Sheets

(56) References Cited

U.S. PATENT DOCUMENTS

| | | | |
|---|---|---|---|
| 2006/0105492 A1 | 5/2006 | Veres et al. | |
| 2006/0205194 A1* | 9/2006 | Bauer | 438/542 |
| 2006/0250076 A1* | 11/2006 | Hofmann et al. | 313/504 |
| 2006/0269656 A1 | 11/2006 | Boroson et al. | |
| 2007/0160846 A1 | 7/2007 | Koinuma et al. | |
| 2007/0231490 A1 | 10/2007 | Boroson et al. | |
| 2007/0249148 A1 | 10/2007 | Werner et al. | |
| 2009/0212280 A1* | 8/2009 | Werner et al. | 257/40 |
| 2010/0084639 A1* | 4/2010 | Schmid et al. | 257/40 |

FOREIGN PATENT DOCUMENTS

| | | |
|---|---|---|
| DE | 10 2004 010954 | 10/2005 |
| EP | 1 329 955 | 1/2003 |
| EP | 1 783 846 | 10/2005 |
| EP | 1 837 927 | 9/2007 |
| EP | 1 860 709 | 11/2007 |
| JP | 2004-527122 | 9/2004 |
| JP | 2007-188870 | 7/2007 |
| JP | 2007-526640 | 9/2007 |
| JP | 2007-273978 | 10/2007 |
| JP | 2008-038241 | 2/2008 |
| JP | 2009-537676 | 10/2009 |
| JP | 2011-054436 | 3/2011 |
| WO | WO 02/082560 | 10/2002 |
| WO | WO 2004/063308 | 7/2004 |
| WO | WO 2005/086628 | 9/2005 |
| WO | WO 2005086251 A2 * | 9/2005 |
| WO | WO 2007134873 A1 * | 11/2007 |
| WO | WO 2008106917 A1 * | 9/2008 |

* cited by examiner

METHOD FOR PRODUCING A DOPED ORGANIC SEMICONDUCTING LAYER

RELATED APPLICATIONS

This is a U.S. national stage of application No. PCT/DE2009/000280, filed on Feb. 25, 2009.

This patent application claims the priority of German patent application no. 10 2008 011 185.6 filed Feb. 27, 2008, the disclosure content of which is hereby incorporated by reference.

FIELD OF THE INVENTION

The invention relates to a process for doping an organic semiconductive layer and to a process for producing an optoelectronic device which has a charge transport layer.

BACKGROUND OF THE INVENTION

Doping of organic semiconductive layers may be advisable, for example, in optoelectronic devices such as organic light-emitting diodes in order to improve the charge carrier injection or the charge carrier transport in the layers. Conventional processes for doping an organic semiconductive layer lead to dopings which are inhomogeneous and/or diffuse within the layer and hence adversely affect both the lifetime of the optoelectronic devices and the reliability of the charge carrier injection. Furthermore, existing methods are inconvenient and costly.

SUMMARY OF THE INVENTION

It is an object of the invention to provide a process for producing a doped organic semiconductive layer which is inexpensive and in which manageable materials are used.

In one embodiment, a process for producing a doped organic semiconductive layer is specified, which has the process steps of A) providing a matrix material, B) providing a dopant complex, and C) simultaneously applying the matrix material and the dopant complex to a substrate by vapor deposition. In process step C), the dopant complex is decomposed and the pure dopant is intercalated into the matrix material. In this case, a readily manageable, especially a volatile and readily evaporable, dopant complex is selected, which, on decomposition, releases the pure dopant which is then intercalated directly into the matrix material.

In process step A), a matrix material can be selected from a group comprising phenanthroline derivatives, imidazole derivatives, triazole derivatives, oxadiazole derivatives, phenyl-containing compounds, compounds with fused aromatics, carbazole-containing compounds, fluorene derivatives, spirofluorene derivatives and pyridine-containing compounds.

Examples of matrix materials which can be provided in process step A) are given hereinafter. A phenanthroline derivative may, for example, be Bphen (4,7-diphenyl-1,10-phenanthroline, formula 1)

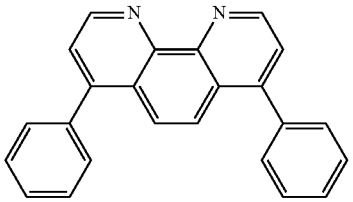

Formula 1 or BCP (2,9-dimethyl-4,7-diphenyl-1,10-phenanthroline, formula 2).

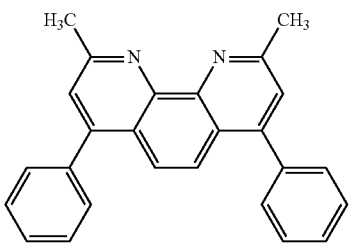

Formula 2

Examples of imidazole derivatives are TPBi (1,3,5-tris-(1-phenyl-1H-benzimidazol-2-yl)benzene, formula 3)

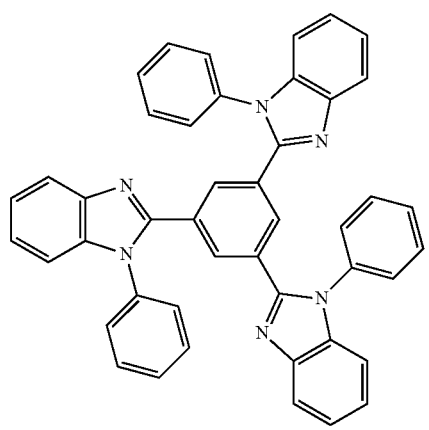

Formula 3 and compounds similar to TPBi.

One example of a triazole derivative is TAZ (3-(4-biphenyl)-4-phenyl-5-(4-tert-butylphenyl)-1,2,4-triazole, formula 4).

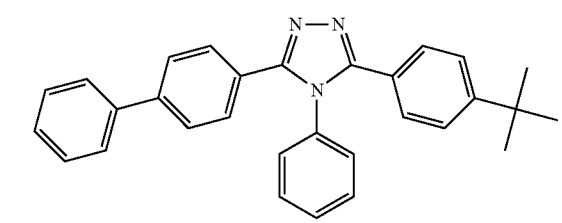

Formula 4

Oxazole derivatives are, for example, Bu-PBD((2-4-biphenylyl)-5-(4-tert-butylphenyl)-1,3,4-oxadiazole).

Phenyl-containing compounds and compounds with fused aromatics are, for example, DPVBi (4,4'-bis(2,2-diphenylethen-1-yl)diphenyl), rubrene, α-NPD (N,N'-bis(naphthalen-1-yl)-N,N'-bis(phenyl)benzidine), 1-TNATA (4,4',4"-tris(N-(naphth-1-yl)-N-phenyl-amino)triphenylamine).

Carbazole-containing compounds may be BCzVBi (4,4'-bis(9-ethyl-3-carbazovinylene)1,1'-biphenyl), but also smaller carbazole derivatives, for example CBP (4,4'-bis(carbazol-9-yl)biphenyl), which can form complexes predominantly via the π system.

In addition, the matrix materials used may also be bipyridyl-, terpyridyl- or tripyridyl-containing compounds, and strongly electron-withdrawing substances, for example $F_4TCNQ$ (tetrafluorotetracyanoguinodimethane).

In addition, in the process, in process step C), the dopant complex may be decomposed to a dopant and at least one ligand. Dopant complexes suitable for the process are those which are evaporable and can decompose in the process, for example complexes with gaseous or volatile ligands.

The dopants selected may additionally be metals and/or metal clusters. The metals may be selected from a group comprising transition metals, lanthanoids and metals of the main groups. It is thus possible to use, for example, Zn, Cd, Hg, Mg, Ca, Sr, Ba, Al, Ga, In, Ti, Bi, Sn, Pb, Fe, Cr, Co, Os, Ru, Rh, Ir, Ni, Cu, Mn, Re, W, Mo, Nb, Zr, As, Sb, V, Ta, Ti, Sc, and, as lanthanoids, for example, Ce, Er, Gd, Hf, La, Nd, Pr, Sm, Tb, Tm, Yb.

The ligand selected in the process may be a ligand from a group comprising carbonyl, phosphine, cyclopentadienyl and arene ligands. These ligands are volatile and can be eliminated from the dopant in the gas phase under the influence of energy, such that the dopant, for example the metal atoms and/or metal clusters, is obtained in pure form. Table 1 gives examples of dopant complexes with illustrative transition metals.

TABLE 1

| Metals/Metal clusters | Example of dopant complex |
| --- | --- |
| Transition group 3 | $Cp_3Sc$ |
| Transition group 4 | $Cp_2Ti(CO)_2$, $Cp_2Ti$(acetylene derivatives), $Cp_2Zr$(acetylene derivatives), $Cp_2Hf$(acetylene derivatives) |
| Transition group 5 | $V(CO)_6$, $V(Cp)_2$, $NbCp_4$, $TaCp_4$ |
| Transition group 6 | $Cr(CO)_6$, dibenzenechromium, $Mo(CO)_6$, $W(CO)_6$ |
| Transition group 7 | $Mn_2(CO)_{10}$, $Re_2(CO)_{10}$ |
| Transition group 8a | $Fe(CO)_5$, $Fe_2(CO)_9$, $Fe_3(CO)_{12}$, ferrocene, $Ru(CO)_5$, $Ru_3(CO)_{12}$, $Ru_6(CO)_{18}$, $Os(CO)_5$, $Os_3(CO)_{12}$ |
| Transition group 8b | $Co_2(CO)_8$, $Co_4(CO)_{12}$, $Co_6(CO)_{16}$, $Rh_2(CO)_8$, $Rh_4(CO)_{12}$, $Rh_6(CO)_{16}$, $Ir_4(CO)_{12}$, $Ir_6(CO)_{16}$ |
| Transition group 8c | $Ni(CO)_4$ |
| Transition group 1b | Cyclopentadienyl(triethylphosphine)-copper(I) |

It is additionally possible to provide, through the reaction of carbonylmetallate anions and carbonylmetal halides, mixed metal carbonyls, for example $(OC)_4Co-Pt(py)_2-Co(CO)_4$, $H_3ReOs_3(CO)_{12}$ and $HCoRu_2(CO)_{13}$. Some or all of the CO ligands may also be replaced by phosphine ligands. This widens the selection of metals in the transition metal series which can be used in the process as a dopant. The cyclopentadienyl or arene ligands may also be substituted in order thus to adjust the evaporation and decomposition properties of the dopant complexes.

Zn can be used as a dopant complex, for example, in the form of $Cp^*_2Zn$ or $Zn(alkyl)_2$ where alkyl=methyl or ethyl.

Main group elements such as Mg, Ca, Sr and Ba can be complexed in the form of $Cp_2Mg$, $Cp^*_2Mg$, $Cp_2Ca$, $Cp_2Sr$ and $Cp_2Ba$.

Individual Al, Ga, In, Tl and Bi atoms can be used in the process as dopant complexes via the alkyl compounds thereof, such as trimethylaluminum, triethylaluminum, trimethylgallium, triethylgallium, trimethylindium, triethylthallium, triphenylbismuth. Thallium may also be complexed in the form of cyclopentadienylthallium.

Dopant complexes with Sn or Pb are, for example, $SnCp_2$ and $PbCp_2$, or the permethylated or perphenylated derivatives thereof, such as $Pb(alkyl, aryl)_4$, $Sn(alkyl, aryl)_4$ where, for example, alkyl=ethyl and aryl=phenyl.

Dopant complexes with As, Sb and Bi may be As(III), Sb(III), Bi(III) with alkyl or aryl ligands and mixed alkyl-hydrogen compounds such as arsine, stibine or bismuthine.

Dopant complexes with lanthanoids, for example Ce, Er, Gd, Hf, La, Nd, Pr, Sm, Tb, Tm and Yb, are, for example, cyclopentadienyl compounds and derivatives thereof such as tris(cyclopentadienyl)cerium, tris(cyclopentadienyl)erbium, tris(cyclopentadienyl)gadolinium, bis(cyclopentadienyl)dimethylhafnium, tris(cyclopentadienyl)lanthanum, tris(cyclopentadienyl)neodymium, tris(cyclopentadienyl)praseodymium, tris(cyclopentadienyl)samarium, tris(i-propylcyclopentadienyl)terbium, tris(cyclopentadienyl)thulium and tris(cyclopentadienyl)ytterbium.

In the process, it is additionally possible in process step C) for the dopant complex to be continuously evaporated and decomposed. The decomposition of the dopant complex can be performed by a method selected from thermal heating with, for example, jets and/or wires, electromagnetic irradiation, for example with lasers, UV or IR, which is matched to the absorption spectra of the dopant complexes used, irradiation with radiofrequencies or microwave irradiation, for example plasmas with the aid of carrier gases. The decomposition of the dopant complex may additionally take place in the gas phase.

It is thus possible to use dopants such as metals, which frequently have very high melting points and are therefore difficult to evaporate, by the use of a decomposable complex of the metals with a volatile compound, such as the above-mentioned ligands. The dopant complex serves as a precursor for controlled provision of the dopant, for example single metal atoms or metal clusters. After the elimination of the ligands, which may take place in the gas phase, the individual metal atoms or the metal clusters prepared in a controlled manner are present. The metal atoms and/or clusters do not coagulate since, under the production conditions, for example as a result of the application of a reduced pressure of $<10^{-4}$ mbar, the mean free path length is greater than the apparatus dimensions. The pure metals and/or metal clusters can therefore be intercalated into the matrix materials before there is any collision and hence cluster formation with further metal atoms.

In addition, in the process, a dopant which forms complexes with the matrix material in the course of intercalation into the matrix material can be used in process step C). The dopant can thus p- or n-dope the matrix material. When, for example, a matrix material and metal atoms and/or clusters are thus simultaneously applied to a substrate by vapor deposition, the metal atoms and/or clusters, once the ligands have been eliminated, can be complexed by the matrix. This can form thermodynamically stable complexes of the particular metal atoms and/or clusters. For example, in the case of Fe as the dopant, an octahedral complex can form with an interaction with three matrix molecules (scheme 1):

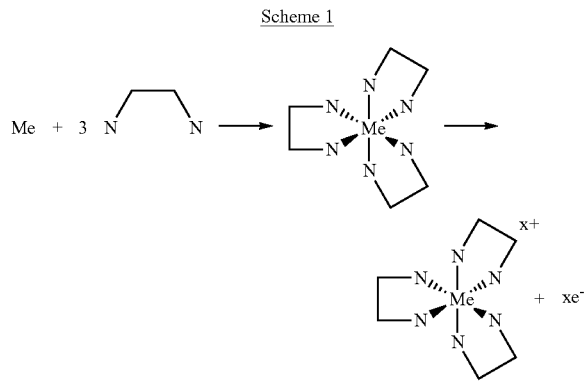

Scheme 1

Scheme 1 shows a schematic of a symbolic matrix material with two nitrogen atoms which can coordinate to a metal Me. For example, the matrix material used may be Bphen or BCP, and the metal Me used Fe or Cr, in which case three matrix molecules complex the metal via the nitrogen atoms thereof. As a result of the complex formation, the metals are incorporated into the matrix material in a fixed manner and can no longer diffuse within the matrix material.

If an organic semiconductive layer is to be n-doped with a dopant, it is possible by way of example to determine whether free electrons are available for n-conduction after the introduction of the dopant into the matrix material. To this end, the electrons on the particular metal atom are counted; in the case of Fe, there are, for example, eight outer electrons. The three illustrative ligands shown in scheme 1 have 3×4=12 electrons available. In the matrix material, the iron atom is thus in an environment of twenty electrons. An electronically stable configuration consists, however, of eighteen electrons. The two excess electrons are now available as charge carriers for electron conduction. The matrix material is thus n-doped.

An analogous calculation for Cr would not give any excess electrons for charge transport. However, the metal Cr is so low in the electrochemical series (−0.56 V) that at least a partial charge transfer to the matrix is to be expected. Analogous calculations also apply to metals such as Ru, for example. A complex of Ru with, for example, a bipyridyl matrix would likewise provide two electrons for n-doping.

In general, the denticity of the matrix is not restricted to two. Higher denticities increase the complex stability. Moreover, this calculation should be understood as a model.

It is merely important that a net charge is available for electron conduction. For example, iron or chromium atoms can also enter into a π bond via two arene ligands.

According to the matrix material and dopant, the environment of the dopant, for example of a metal atom, may vary.

It is thus possible for linear, tetrahedral, octahedral or trigonal bipyramidal complexes with the matrix material to arise. For example, copper complexes with phenanthroline in a tetrahedral arrangement. The same considerations also apply for metal clusters which are prepared in a controlled manner and consist of two, three or more metal atoms.

An aspect of the invention relates to a process for producing an optoelectronic device. The device has a substrate, a first electrode on the substrate, which in operation releases charge carriers of a first charge, a first charge transport layer which transports charge carriers of the first charge, at least one emission layer on the first charge transport layer, and a second electrode on the at least one emission layer, which in operation releases charge carriers of a second charge. In the process, the first charge transport layer has been produced by a process according to the details given above.

It is therefore possible to produce an optoelectronic device, for example an organic light-emitting diode, which has at least one charge transport layer which, owing to the doping, has increased charge carrier injection. The doping may, for example, be n-doping. In that case, the first electrode is an electron-injecting cathode and the charge transport layer is an electron transport layer. The above-described process can achieve homogeneous doping of the charge transport layer, which results in an increased lifetime of the device.

DETAILED DESCRIPTION OF THE DRAWINGS

Figure 1:
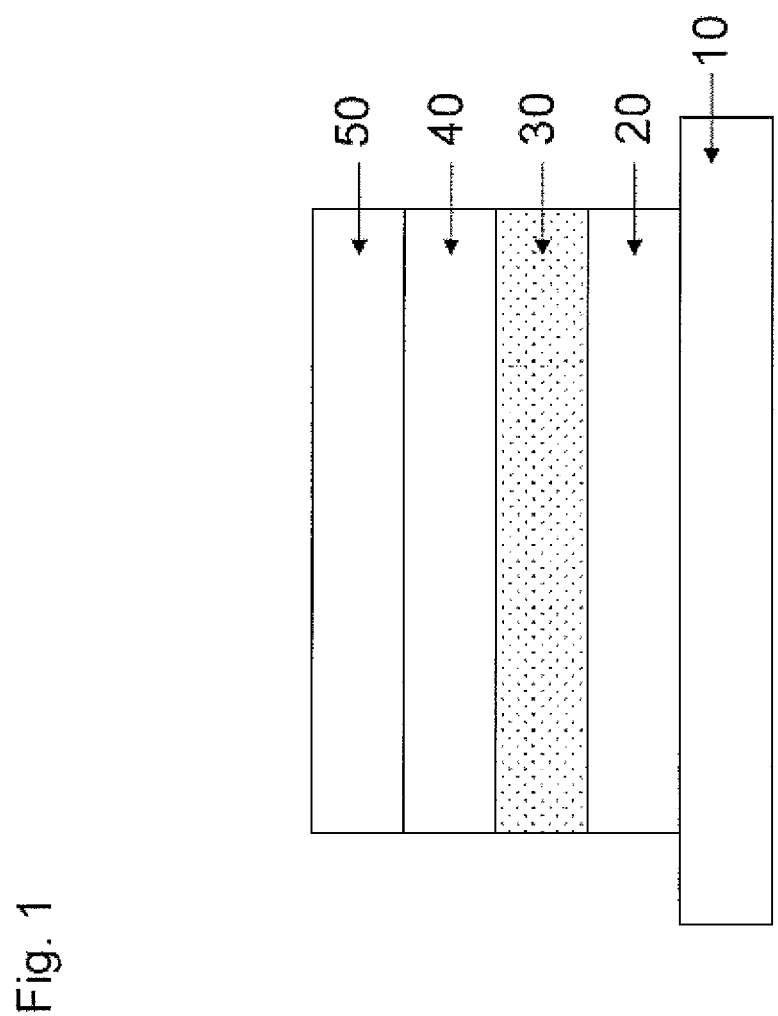
FIG. 1 shows the schematic side view of an organic light-emitting diode.

FIG. 1 shows the schematic side view of an organic light-emitting diode with a substrate 10, a first electrode 20, a first charge transport layer 30, an emission layer 40, and a second electrode 50. The charge transport layer 30 has a doping of the matrix material, and has been produced by one of the processes described above with the matrix materials and dopants mentioned there. If required, such a layer is also useable for other components. An organic light-emitting diode may additionally have a second charge transport layer and/or a plurality of emission layers (not shown here).

Figure 2:
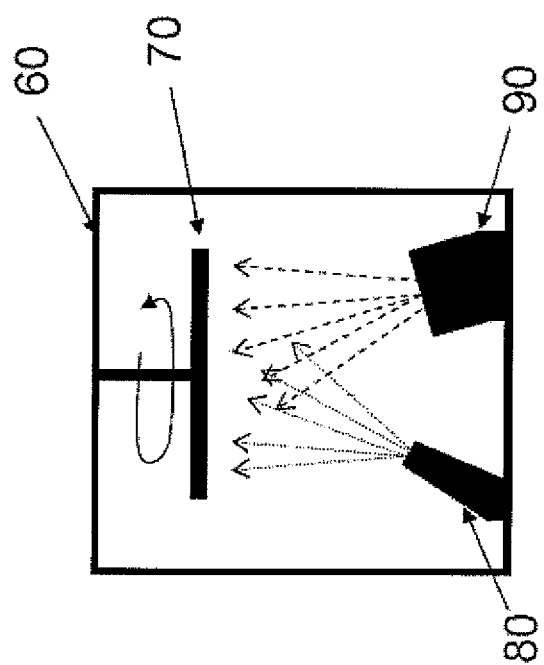
FIG. 2 shows a schematic of an illustrative device for producing a doped organic semiconductive layer.

FIG. 2 shows a schematic of an illustrative device for producing a doped organic semiconductive layer. Within a vacuum recipient 60 is a rotating substrate plate 70, on which a dopant complex is applied by vapor deposition to the substrate plate from an electrically heated ceramic nozzle 80 (indicated by dotted arrows). In addition, matrix material is applied by vapor deposition to the substrate plate from a current-heated molybdenum boat 90 (indicated by dashed arrows). This makes it possible to produce, on the substrate plate 70, an organic semiconductive layer which has a matrix material with homogeneously intercalated dopant.

In a working example, according to FIG. 2, $Fe(CO)_5$ is heated to 110° C. in a previously evacuated pressure vessel. The internal pressure rises to about 1 bar. The evaporated dopant complex is passed at a passage rate of approx. 20 sccm through an electrically heated, white-hot ceramic nozzle 80 into the vacuum recipient 60. The nozzle points obliquely toward the rotating substrate 70. A similarly mounted current-heated molybdenum boat 90 serves to deposit a matrix material, for example BCP. The current through the molybdenum boat is adjusted such that a growth rate of 0.1 nm/s is established. In this way, 30 nm of iron-doped BCP are prepared within approximately five minutes.

When, for example, $Ni(CO)_4$ is used in place of $Fe(CO)_5$, the pressure vessel is heated only to 40° C. This affords a nickel-doped layer.

It is additionally possible to use triethylaluminum in place of $Fe(CO)_5$. The pressure vessel is then heated to 80° C.

The $Fe(CO)_5$ can also be passed through a cold nozzle. In that case, a laser source is focused one centimeter above the inlet, which is matched to the absorption pressure frequency of 2200 to 1700 $cm^{-1}$ of the IR carbonyl bands of the $Fe(CO)_5$ and can thus decompose the dopant complex (the laser source is not shown in FIG. 2).

It is additionally possible to introduce solid $Cr(CO)_6$ into a current-controlled source and to decompose it analogously to the examples cited above.

Instead of $Cr(CO)_6$, it is also possible to use dibenzenechromium. A sufficiently strong red laser can be used to eliminate the arene ligands.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A process for producing a doped organic semiconductive layer, comprising the steps of:

A) providing a matrix material;

B) providing a dopant complex wherein the dopant complex comprises a dopant and at least one ligand and wherein the dopant complex is selected from $Cp_3Sc$, $Cp_2Ti(CO)_2$, $Cp_2Ti$(acetylene derivatives), $Cp_2Zr$(acetylene derivatives), $Cp_2Hf$(acetylene derivatives), $V(Cp)_2$, $NbCp_4$, $TaCp_4$, dibenzenechromium, cyclopentadienyl(triethylphosphine)copper (I), $(OC)_4Co$—$Pt(py)_2$-$Co(CO)_4$, $H_3ReOs_3(CO)_{12}$ and $HCoRu_2(CO)_{13}$, $Zn(methyl)_2$, $Zn(ethyl)_2$, $Cp_2Mg$, $Cp_2Ca$, $Cp_2Sr$, $Cp_2Ba$, trimethylaluminum, triethylaluminum, trimethylgallium, triethylgallium, trimethylindium, triethylthallium, triphenylbismuth, cyclopentadienylthallium, $SnCp_2$, $PbCp_2$, Pb(ethyl, phenyl)$_4$, Sn(ethyl, phenyl)$_4$, arsine, stibine, bismuthine, tris(cyclopentadienyl)cerium, tris(cyclopentadienyl)erbium, tris(cyclopentadienyl)gadolinium, bis(cyclopentadienyl)dimethylhafnium, tris(cyclopentadienyl)lanthanum, tris(cyclopentadienyl)neodymium, tris(cyclopentadienyl)praseodymium, tris(cyclopentadienyl)samarium, tris(i-propylcyclopentadienyl)terbium, tris(cyclopentadienyl)thulium, or tris(cyclopentadienyl)ytterbium; and C) simultaneously applying the matrix material and the dopant complex to a substrate by vapor deposition, wherein, in process step C)

the dopant complex is decomposed to the dopant and at least one ligand, the dopant is a metal and/or metal cluster, the dopant is intercalated into the matrix material; and wherein the mean free path length of the metal and/or metal cluster is greater than the apparatus dimensions.

2. The process as claimed in claim 1, wherein, in process step C), the dopant complex is continuously evaporated and decomposed.

3. The process as claimed in claim 1, wherein, in process step C), the dopant complex is decomposed by a method selected from thermal heating, electromagnetic irradiation, irradiation with radiofrequencies and microwave irradiation.

4. The process as claimed in claim 3, wherein the decomposition of the dopant complex takes place in the gas phase.

5. The process as claimed in claim 1, wherein the dopant n-dopes the matrix material.

6. A process for producing an optoelectronic device which comprises a substrate, a first electrode on the substrate, which in operation releases charge carriers of a first charge, a first charge transport layer which transports charge carriers of the first charge, at least one emission layer on the first charge transport layer, and a second electrode on the at least one emission layer, which in operation releases charge carriers of a second charge, wherein the first charge transport layer has been produced by a process as claimed in claim 1.

7. The process as claimed in claim 1 wherein the dopant complex is selected from the group consisting of $Cp_3Sc$, $Cp_2Ti(CO)_2$, $Cp_2Ti$(acetylene derivatives), $Cp_2Zr$(acetylene derivatives), $Cp_2Hf$(acetylene derivatives), $V(C_P)_2$, $NbCp_4$, $TaCp_4$, dibenzenechromium, cyclopentadienyl(triethylphosphine)copper (I), $(OC)_4Co$—$Pt(py)_2$-$Co(CO)_4$, $H_3ReOs_3(CO)_{12}$ and $HCoRu_2(CO)_{13}$, $Zn(methyl)_2$, $Zn(ethyl)_2$, $Cp_2Mg$, $Cp_2Ca$, $Cp_2Sr$, $Cp_2Ba$, cyclopentadienylthallium, $SnCp_2$, $PbCp_2$, Pb(ethyl, phenyl)$_4$, Sn(ethyl, phenyl)$_4$, tris(cyclopentadienyl)cerium, tris(cyclopentadienyl)erbium, tris(cyclopentadienyl)gadolinium, bis(cyclopentadienyl)dimethylhafnium, tris(cyclopentadienyl)lanthanum, tris(cyclopentadienyl)neodymium, tris(cyclopentadienyl)praseodymium, tris(cyclopentadienyl)samarium, tris(i-propylcyclopentadienyl)terbium, tris(cyclopentadienyl)thulium, and tris(cyclopentadienyl)ytterbium.

* * * * *